United States Patent [19]
DiStefano

[11] Patent Number: 5,192,588
[45] Date of Patent: Mar. 9, 1993

[54] ELECTROFORMED METHOD FOR FABRICATING ROUND MESA MILLIMETER WAVE WAFFLELINE STRUCTURE

[75] Inventor: Ralph D. DiStefano, Palm Bay, Fla.

[73] Assignee: Harris Corporation, Melbourne, Fla.

[21] Appl. No.: 665,263

[22] Filed: Mar. 5, 1991

[51] Int. Cl.⁵ .............................................. H01L 21/00
[52] U.S. Cl. ........................................ 427/247; 205/67; 156/656; 156/645; 156/664; 156/649
[58] Field of Search ............................ 205/76, 78, 67; 427/239, 247; 156/656, 645, 665, 664, 649

[56] References Cited

U.S. PATENT DOCUMENTS

| | | | |
|---|---|---|---|
| 3,322,653 | 3/1958 | Morris | 205/78 |
| 3,607,484 | 9/1971 | Marukawa | 156/665 |
| 4,125,441 | 11/1978 | Dugan | 205/78 |
| 4,173,075 | 11/1979 | Stewart | 156/665 |
| 4,338,164 | 7/1982 | Spohr | 205/78 |
| 4,890,195 | 12/1989 | Heckaman et al. | 29/447 |

Primary Examiner—Brian E. Hearn
Assistant Examiner—George Goudreau
Attorney, Agent, or Firm—Evenson, Wands, Edwards, Lenahan & McKeown

[57] ABSTRACT

A method for manufacturing a Waffleline structure includes making holes in predetermined array pattern through a substrate material sheet, depositing layers of materials on the sheet until the holes are filled, machining the layers off a first side of the sheet to expose the substrate material, and etching the substrate material away, leavign a Waffleline structure having an array of mesas of the layers of material disposed on a base of the layers of material. The method may additionally include applying a mask to the first side of the sheet after the step of machining, and depositing further layers of material on a second side of the sheet opposite the first side following the step of applying the mask. The method may additionally comprise the steps of vapor blasting, chemically cleaning, or brushing the Waffleline structure following the step of etching.

24 Claims, 4 Drawing Sheets

ELECTROFORMED METHOD FOR FABRICATING ROUND MESA MILLIMETER WAVE WAFFLELINE STRUCTURE

BACKGROUND AND SUMMARY OF THE INVENTION

The present invention relates to a method for manufacturing a Waffleline structure, and particularly a method for manufacturing a Waffleline structure quickly and efficiently, employing little manual labor.

A Waffleline structure includes a flat base and a plurality of mesas extending from the surface of the base in a predetermined array pattern. The mesas typically have predetermined dimensions, such a height, width, etc. Wires may be wound around the Waffleline structure in between the mesas. It has been recognized that wire wear and breakage may be reduced if mesas have round, rather than sharp-edged, perimeters. Accordingly, a conventional method for producing a Waffleline structure has included drilling holes in a flat sheet of base material in a predetermined array pattern, and inserting cylindrical pins into each of the holes. Understandably, inserting a large number of pins in holes in a base can be a labor intensive task. Even if insertion of the pins is automated, a considerable length of time may be required for producing a single finished structure. Also, the large number of mechanical operations required may lead to an unacceptably high rate of damage, defects or unsatisfactory completion of the task.

Accordingly, it is an object of the present invention to provide a method for manufacturing a Waffleline structure which does not require inserting pins into holes. In addition, an object of the present invention is to provide a method for manufacturing a Waffleline structure which may be carried out quickly and efficiently, requiring relatively little manual or mechanical labor.

In accordance with the above and other objects, there is provided in accordance with the invention a method for manufacturing a Waffleline structure comprising the steps of drilling holes of a predetermined diameter in a predetermined array pattern through a sheet of substrate material, depositing layers of material on the sheet until the holes are filled, machining the layers off a first side of the sheet to expose the substrate material, and etching the substrate material away, leaving a Waffleline structure having an array of mesas of the layers of material.

As will be seen from the discussion which follows, a method for manufacturing a Waffleline structure in accordance with the invention has numerous advantages over a conventional method. First, the manual labor involved in inserting pins is saved, because the mesas are produced by etching away substrate materials surrounding the mesas, rather than by inserting them into holes in the base. Also, there is no need for bonding pins into the base material, since the layers making up the base and the mesas are formed concurrently. Also, since little mechanical work is done in accordance with the method of the invention, there is a substantially decreased likelihood that damage or improper assembly will cause the yield of Waffleline structures to be reduced.

DETAILED DESCRIPTION OF PREFERRED EMBODIMENTS

Figure 1:
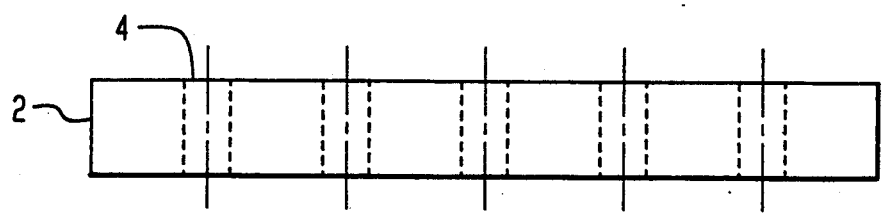
FIGS. 1-4 show a sequence of steps in the method of manufacturing a Waffleline structure according to a first embodiment of the invention.

FIG. 1 shows an edge-on view of a sheet of substrate material 2. The substrate material is preferably made of a substance, such as aluminum, which may be dissolved by commonly available etching solutions. A series of holes 4 have been drilled through the substrate material 2 according to a predetermined array pattern. The holes 4 are shown in FIG. 1 as broken (i.e., hidden) lines, and center lines run through the holes 4. While the holes may be any desired shape, a round implement such as a drill bit was employed to produce cylindrical holes 4 in a presently preferred embodiment. The diameter of the holes 4 may be predetermined in accordance with the application to which the finished Waffleline structure is to be applied. Preferred embodiments have been made with 32 mil holes on 50 mil centers and 16 mil holes on 25 mil centers.

Figure 2:
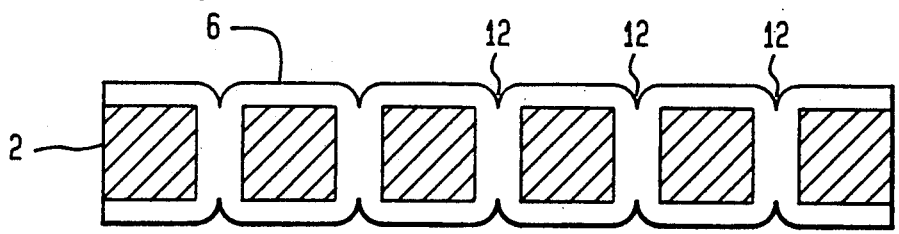
Figure 5:
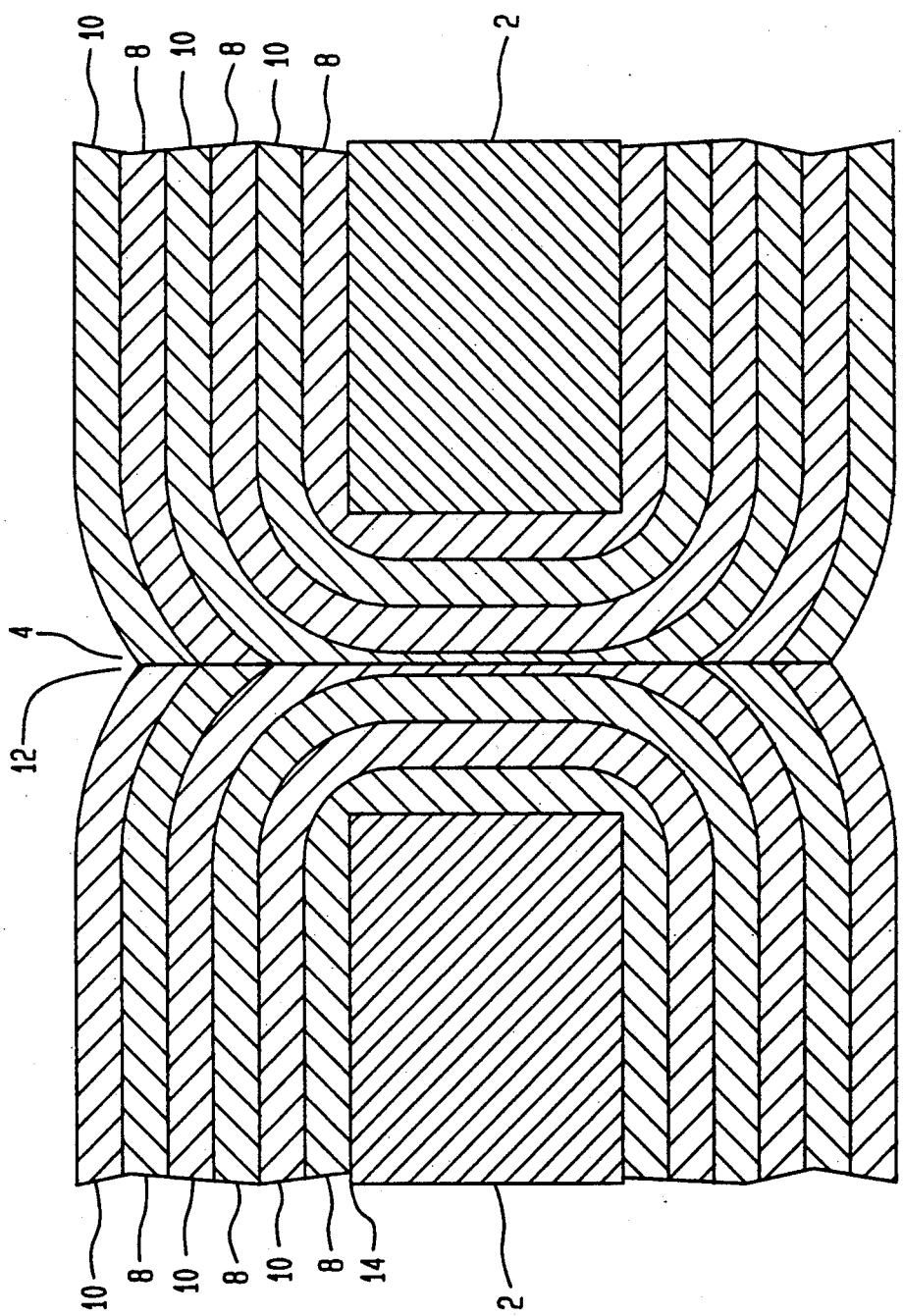
FIG. 5 shows a detailed view of a portion of the Waffleline structure at the stage shown in FIG. 2.

After the holes 4 have been drilled or otherwise produced, the substrate material 2 is repeatedly immersed in an electrolytic solution. Layers of material are deposited on the sheet of substrate material 2. In FIG. 2, the layers of material are shown collectively within the envelope designated by the numeral 6. FIG. 5 shows a more detailed view of a portion of FIG. 2. Two portions of the substrate material 2 are shown. In the middle part of FIG. 5, a hole 4 has been filled in with collective layers 6 of material. In a preferred embodiment, the collective layers 6 are alternating copper layers 8 and nickel layers 10. In particular, a preferred embodiment has been made by initially plating the aluminum substrate 2 in a Rochelle copper bath for 30 minutes and then applying alternating layers 8, 10 of nickel and copper plating. It will be seen that layers build up on the inside of the hole 4 until the hole 4 is completely filled and closed off. Further layers are deposited, and each additional layer causes a central dimple 12 to move outwardly. When the bottom of the dimple 12 has reached a predetermined distance beyond the surface 14 of the substrate material 2, no additional layers are added.

Figure 3:
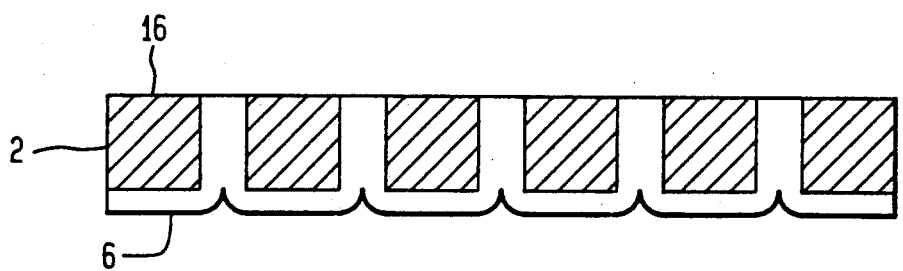

FIG. 3 shows a further step in the method for manufacturing the Waffleline structure. Between FIGS. 2 and 3, the layers of material deposited as shown in FIG. 5 have been removed by machining from a first side 16 of the substrate material 2. The machining may be performed by a suitable means such as scraping, slicing, abrading, etc. The machining is done so that a layer of the substrate material 2 is exposed on one side.

Figure 4:
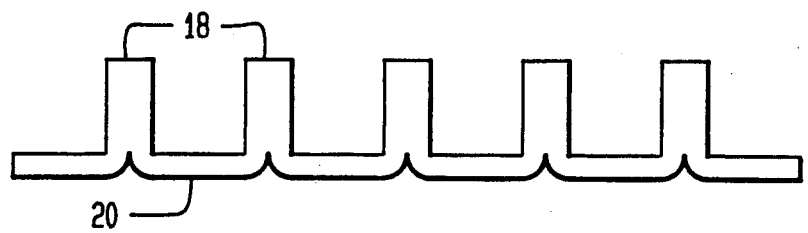

As shown in FIG. 4, the next step involves etching away the substrate material 2. The etching may be done by immersing the structure in a bath made up of a suitable solution, such as hydrochloric acid or sodium hydroxide. After the etching has been completed, the layers of material which had been in the holes 4 are now exposed and remain as mesas 18. The mesas 18 are coupled to each other by a base 20 made up of the layers of material deposited on a second side 21 of the substrate material opposite to the first side 16.

Figure 6:
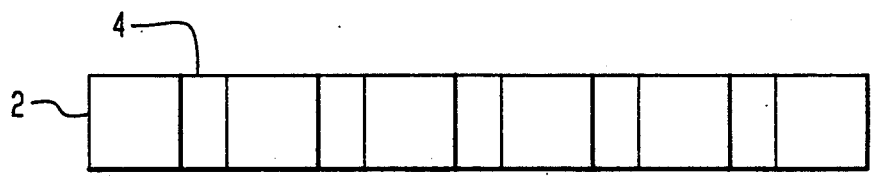
FIGS. 6-10 show a sequence of steps in the method for manufacturing a Waffleline structure according to a second embodiment of the invention.
Figure 7:
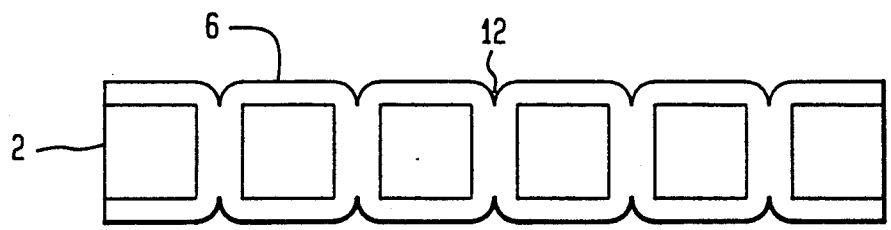
Figure 8:
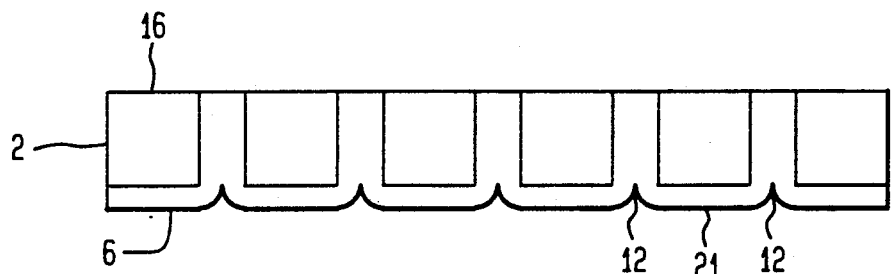

The method according to the invention may also be practiced according to a second embodiment described in conjunction with FIGS. 6-10. FIGS. 6-8 correspond to FIGS. 1-3, and represent substantially identical method steps. Following the step of machining which results in the structure shown in FIGS. 3 and 8, additional steps are performed in accordance with the second embodiment. A mask layer 22 is deposited on the first side 16 after the layers have been machined away. The mask layer 22 may be made of any suitable substance, such as a conformal coating or an organic polymer resin, which covers the first side 16 and prevents either corrosion or additional deposits of material.

After the mask layer 22 is applied, additional layers 8, 10 of material are deposited on the second side. The result is the structure shown in FIG. 9. It will be seen that the additional layers 8, 10 of material deposited on the second side 21 of the structure provide a thicker base 20, and also tend to smooth out the dimples 12 which are more prominent in FIG. 8. The additional layers may be applied until a predetermined value of the base is achieved. In other words, the additional layers of material are applied until the distance between the surface of the last layer of material added and the surface of the substrate material has reached a predetermined value.

Afterward, a step of etching is performed substantially in accordance with that of the first embodiment. The mask layer 22 may be removed prior to the etching by a suitable solvent or a suitable mechanical process. Alternatively, the mask layer 22 may be etched away concurrently with the etching of the substrate material. Whether the mask layer 22 is to be removed prior to or concurrently with the etching of the substrate material 2 may be determined by factors such as the chemical composition of the mask layer 22 and what type of etching solution is employed.

Figure 9:
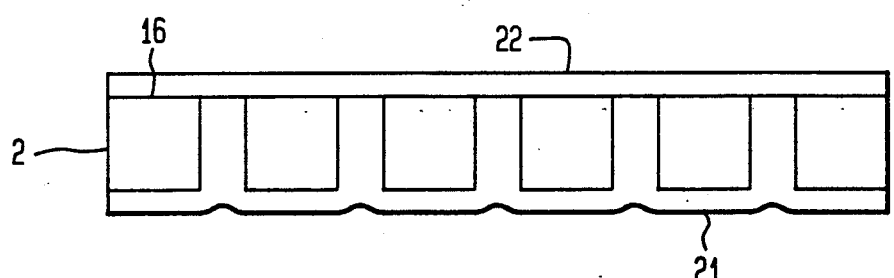
Figure 10:
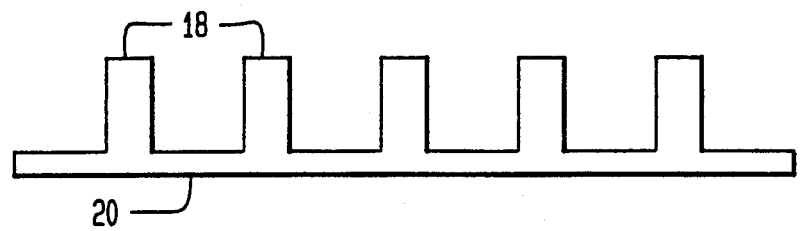

In either case, after the step of etching, the resultant structure is as shown in FIG. 10. As in the case of FIG. 4, mesas 18 remain, which are made of layers of material which had been built up in the holes 4 through the sheet of substrate material 2. A base 20 also remains. Because additional layers of material were disposed on the second side as shown in FIG. 9, the Waffleline structure shown in FIG. 10 has a thicker base 20 than that shown in FIG. 4. This greater thickness provides advantageous stability and resistance to breakage.

Figure 11:
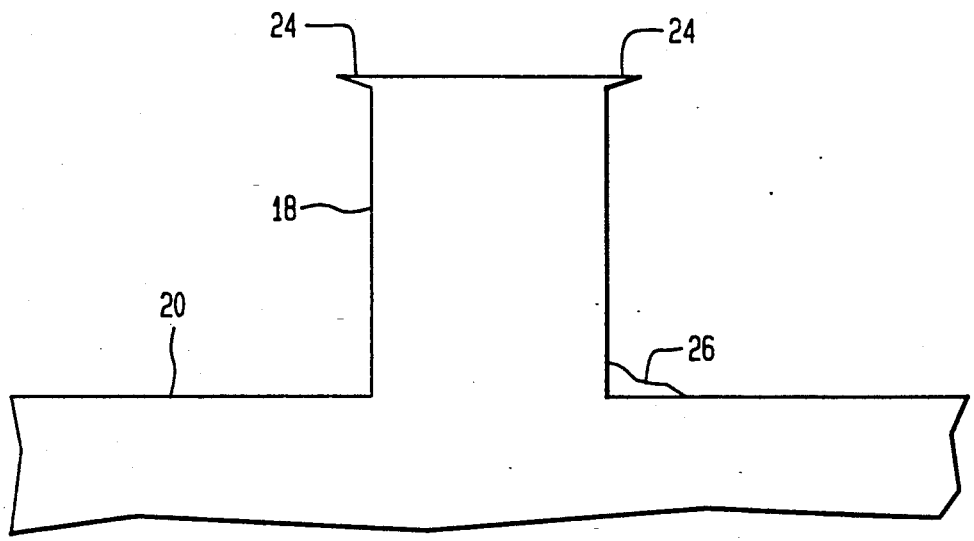
FIG. 11 shows a detailed view of a portion of the structure shown in FIG. 4 or FIG. 10.
Figure 12:
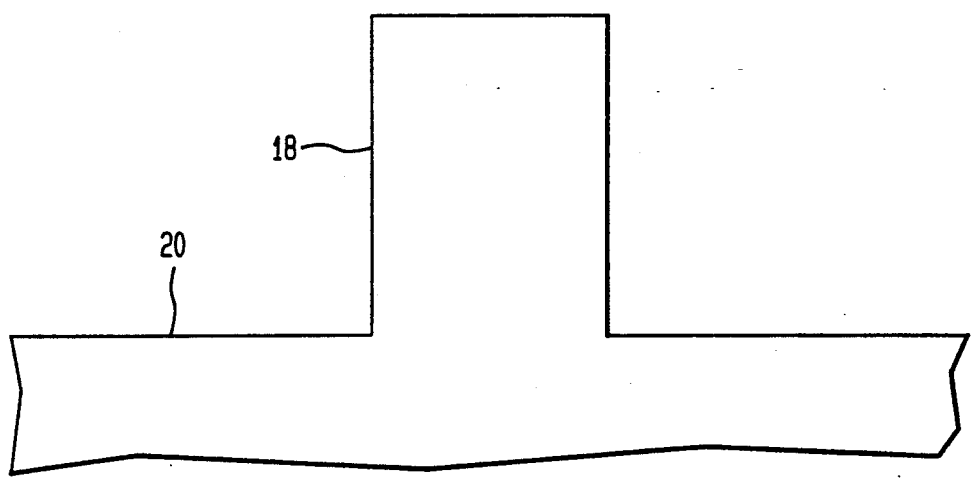
FIG. 12 shows the close-up view of FIG. 11 following an additional method step.

Following the step of etching, which produces the structures shown in FIGS. 4 and 10, either of the two embodiments may include an additional step. FIG. 11 shows a close-up view of a single mesa 18 on a portion of the base 20 of the structure of FIG. 4 or FIG. 10. The step of machining may produce a burr 24 on the top end of the mesa 18. After the substrate material 2 is etched away, the burr 24 is exposed. The burr 24 may be removed by an additional step of brushing the Waffleline structure with a suitable implement such as a wire brush. The wire brush may also remove any residue 26 which may remain on the Waffleline structure following the step of etching. Accordingly, the step of brushing removes the burr 24 and the residue 26 shown in FIG. 11 to produce the clean, finished Waffleline structure shown in FIG. 12.

As an alternative to removing the residue 26 by brushing, an additional step of chemically cleaning the Waffleline structure using a suitable cleaning solution or solvent may be employed following the step of etching.

Due to burr formation or any slight deformation in the hole 4, following the step of etching the upper end of the mesa 18 may take on a slight mushroom shape. The mesa shown in FIG. 11 has the burr 24 on both sides as shown, thus suggesting the shape of a mushroom. Of course, depending on how the structure has been machined, the burr 24 may only appear on one side. In any case, the shape of the mesa 18 may be changed from that of FIG. 11 to the unblemished cylinder of FIG. 12 by chemically cleaning, vapor blasting or brushing the mesas following etching. Of course, the steps of vapor blasting, brushing, and chemically cleaning may be performed in any combination or any sequence following the step of etching.

In accordance with the invention as described in the above embodiments, there is produced a Waffleline structure having mesas disposed in a predetermined array pattern. The mesas preferably have a cylindrical shape for avoiding sharp edges which may cause damage to wires wrapped around the Waffleline structure. A method in accordance with the invention advantageously reduces the amount of manual or other mechanical labor involved in producing such a Waffleline structure.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A method for manufacturing a Waffleline structure comprising the steps of:
    making holes of predetermined dimensions in a predetermined array pattern through a substrate material sheet;
    depositing layers of material on the sheet until the holes are filled;
    machining a portion of the deposited layers off a first side of the sheet to expose the substrate material; and
    etching the substrate material away, leaving a Waffleline structure having an array of mesas of the layers of material disposed on a base of the layers of material.

2. A method as recited in claim 1, wherein the step of making holes includes drilling.

3. A method as recited in claim 1, wherein the substrate material is aluminum, and the step of etching includes etching with an aluminum etchant.

4. A method as recited in claim 3, wherein the step of etching includes etching with a solution including one of sodium hydroxide and hydrochloric acid.

5. A method as recited in claim 1, wherein the step of depositing comprises one of electrolytic and electroless deposition.

6. A method as recited in claim 1, wherein the step of depositing includes depositing a layer of cooper in a Rochelle copper bath.

7. A method as recited in claim 1, wherein the step of depositing includes depositing alternating layers of different materials.

8. A method as recited in claim 7, wherein the different materials are copper and nickel.

9. A method as recited in claim 1, wherein the step of depositing includes depositing layers of material until the holes are filled to a predetermined distance beyond a surface of the sheet of substrate material.

10. A method as recited in claim 1, further comprising the steps of:
applying a mask to the first side of the sheet after the step of machining; and
depositing further layers of material on a second side of the sheet opposite the first side following the step of applying the mask.

11. A method as recited in claim 10, wherein the step of depositing further layers continues until a predetermined thickness of layers over the surface of the second side of the sheet is produced.

12. A method as recited in claim 10, wherein the step of depositing further layers comprises one of electrolytic and electroless deposition.

13. A method as recited in claim 10, wherein the step of depositing further layers includes depositing alternating layers of different materials.

14. A method as recited in claim 13, wherein the different materials are copper and nickel.

15. A method as recited in claim 10, further comprising the step of removing the mask following the step of depositing further layers.

16. A method as recited in claim 15, wherein the step of removing is done prior to the step of etching.

17. A method as recited in claim 15, wherein the step of removing is done concurrently with the step of etching.

18. A method as recited in claim 1, further comprising the step of vapor blasting the mesas following the step of etching.

19. A method as recited in claim 18, wherein the step of vapor blasting produces the mesas from a mushroom shape to a cylinder shape.

20. A method as recited in claim 1, further comprising the step of chemically cleaning the Waffleline structure after the step of etching.

21. A method as recited in claim 1, further comprising the step of brushing the Waffleline structure with a wire brush to remove unwanted burrs and residue.

22. A method of manufacturing a waffleline-configured structure comprised of an array of conductive mesas that extend from a support base, said mesas being of predetermined dimensions and disposed in a predetermined array pattern, comprising the steps of:
(a) drilling an array of holes of predetermined dimensions through a conductive substrate, so as to intersect first and second surfaces thereof, said array of holes defining a predetermined hole pattern in said conductive substrate;
(b) electrolessly depositing and building up multiple layers of conductive material on sidewalls of the holes of said array and on said first and second surfaces of said conductive substrate, so as to completely fill said holes and build up conductive material on said first and second surfaces of said conductive substrate;
(c) machining built up conductive material that has been deposited upon said first surface of said conductive substrate, thereby exposing conductive material within the holes of said array; and
(d) etching away said conductive substrate, thereby leaving an array of conductive mesas corresponding to the conductive material that has been deposited in and fills the holes of said array, said array of conductive mesas extending from conductive material that has built up on said second surface of said conductive substrate which forms a support base for said array of conductive mesas.

23. A method according to claim 22, wherein step (b) comprises electrolessly depositing and building up alternate layers of different conductive materials on sidewalls of the holes of said array and on said first and second surfaces of said conductive substrate.

24. A method according to claim 22, wherein step (c) further includes the steps of forming a mask on said first surface of said conductive substrate after machining built up conductive material that has been deposited upon said first surface of said conductive substrate, and depositing further layers of conductive material on said second surface of said conductive substrate.

* * * * *